US006880136B2

United States Patent
Huisman et al.

(10) Patent No.: US 6,880,136 B2
(45) Date of Patent: Apr. 12, 2005

(54) METHOD TO DETECT SYSTEMATIC DEFECTS IN VLSI MANUFACTURING

(75) Inventors: Leendert M. Huisman, South Burlington, VT (US); Maroun Kassab, St-Eustache (CA); Leah M. P. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 10/191,212

(22) Filed: Jul. 9, 2002

(65) Prior Publication Data

US 2004/0009616 A1 Jan. 15, 2004

(51) Int. Cl.$^7$ .................. G06F 17/50; G01R 31/26; H01L 21/00
(52) U.S. Cl. ................ 716/4; 438/10; 438/17
(58) Field of Search ............... 716716/4–6, 2; 438/5, 10, 17–18, 14

(56) References Cited

U.S. PATENT DOCUMENTS

| 4,503,536 A | 3/1985 | Panzer |
| 4,835,458 A | 5/1989 | Kim |
| 5,239,262 A | 8/1993 | Grutzner et al. |
| 5,297,151 A | 3/1994 | Gruetzner et al. |
| 5,414,716 A | 5/1995 | Bershteyn |
| 5,485,471 A | 1/1996 | Bershteyn |
| 5,497,381 A | 3/1996 | O'Donoghue |
| 5,515,384 A | 5/1996 | Horton, III |
| 5,652,754 A | 7/1997 | Pizzica |
| 5,727,000 A | 3/1998 | Pizzica |
| 6,018,813 A | 1/2000 | Chakradhar et al. |

OTHER PUBLICATIONS

Groce, Jason, International Sematech. Technology Transfer # 99053735A–TR "Advanced Process Control Framework Initiative (APCFI) Project: Overview" Jun. 30, 1999 <<http://www/sematech.org/docubase/document/3735atr.pdf>>.*

Groce, Jason, International Sematech. Technology Transfer # 99053736A–TR "Advanced Process Control Framework Initiative (APCFI) Project: Detailed System Description" Jun. 30, 1999 <<http:www.sematech.org/docubase/document/3736atr.pdf>>.*

M.S.Hall, R.B.Hitchcock, Sr. and J.L. Rivero; IBM Technical Disclosure Bulletin, vol. 27, No. 10A, Mar. 1985.

* cited by examiner

*Primary Examiner*—Craig A. Thompson
(74) *Attorney, Agent, or Firm*—Robert A. Walsh

(57) ABSTRACT

Defects in manufacturing of IC devices are analyzed by testing the devices for defects using results of LSSD technology to find at least one failing pattern that contains incorrect values. The failing latches are used as a starting point to trace back through combinational logic feeding the failing latches, until controllable latches are encountered. A decision is then made to continue the back tracing or not depending on whether the latter latches were clocked during the application of one of the failing patterns or not.

22 Claims, 3 Drawing Sheets

Commonality Analysis Data Flow

Tracing through Backcones

METHOD TO DETECT SYSTEMATIC DEFECTS IN VLSI MANUFACTURING

FIELD OF THE INVENTION

This invention relates to the analysis of defects detected in integrated circuit (IC) devices manufactured using VLSI technology. More particularly, the invention is directed to detecting structural commonalities of VLSI manufacturing defects.

BACKGROUND

With modem manufacturing techniques, the yield of digital CMOS or memory circuits is primarily limited by random defects that result from random effects such as dust particles or other materials floating in the air, a person coughing or sneezing, etc. Non-random (systematic) defects that result from problems with the manufacturing process and are reproduced regularly on successive ICs, as well as parametric defects in which a part may not quite meet specifications but is still functional, should be reduced or eliminated through rapid learning techniques during the course of manufacturing products in large volumes.

IC chips are fabricated as separate dies on semiconductor wafers. Each die is probed for testing, with failing dies marked with an ink spot. The passing dies are taken from the wafer and assembled into packaged parts, which are again tested. The patterns of good and failing chips at either a wafer or a packaged part level have been used to identify underlying problems in the manufacturing process. This has involved generating a two-dimensional wafer pattern map upon which the defective chips are noted, overlying the wafer defect maps on wafer "signature" maps which display typical defect patterns for various manufacturing line problems, and manually comparing the two in an effort to establish correlation. The identification of statistical trends and development of correlation models has also been used for fault diagnosis; see Kibarian and Strojwas, "Using Spatial Information To Analyze Correlation Between Test Structure Data", IEEE Transactions on Semiconductor Manufacturing, Vol. 4, No. 3, August 1991. However, the graphical analysis of two-dimensional wafer patterns is an interactive and time consuming process and not practical for application in a real time manufacturing flow.

Another technique that has been used to determine the systematic versus random components of yield loss involves "windowing" on a wafer map. This technique is described, for example, in Stapper et al., "Integrated Circuit Yield Statistics", Proceedings of the IEEE, Vol 71, No 4, April 1983. It allows the yield to be determined as a function of a "window" of increasing size that is moved around the wafer map. The window is increased from a single die size to two dies, three dies, four dies, and further multiples. Since the likelihood of a defect being included within a particular window area increases as the size of the window become greater, the yield experiences a corresponding reduction. The yields for different window sizes are plotted on the Y-axis of a logarithmic scale against the window area, which is plotted on the X-axis. The resulting curves are extended to intercept the Y-axis, at which the window size is a theoretical zero. The point at which the Y-axis is intercepted is referred to as $Y_o$, and is taken to represent the portion of the total defects attributable to non-random defects. While this technique provides an approximation of the random versus non-random components of defects that effect wafer yield, it is laborious, time consuming, and not particularly accurate.

SUMMARY OF THE INVENTION

VLSI manufacturing yield enhancement involves detecting root causes of defects. The present invention is directed to a method using software based analysis of fail data and design data that detects structural defect commonalities, and helps select a failing chip for failure analysis that is likely to contain a systematic defect rather than a random one.

The present invention assists reducing the number of defective chips, as found during testing. Logic testing simply consists of applying constants to primary inputs, in order to configure the chip in a certain test mode. Test vectors are then applied to primary inputs, and inserted into scan chains. The results of the tests are collected by measuring the primary outputs and scanning out the chains. Manufacturing defects are assumed when the results do not match what is expected. Assuming the scan chains are faultless, the defect is located in the sub-circuit involved in computing the unexpected logic values.

Analysis of the defective chips is necessary to provide the feedback to manufacturing for product reliability enhancements and better yields. To illustrate this process, attention is directed to FIG. 1, wherein a simplified VLSI manufacturing feedback loop is shown consisting of identifying failing chips that contain systematic defects, diagnosing them, performing physical analysis, and then providing feedback to manufacturing.

Perfect yields in VLSI chip manufacturing is almost impossible to achieve due to many complex manufacturing steps, and the inevitable slight imperfections of the increasingly shrinking components. Therefore, the probability of a certain component being defective is non zero and yield is less than 100%. Component defect sensitivity is affected by feature sizes and physical design rules. The wafer yield decreases exponentially with respect to component count or chip area. Consequently, maximizing profit involves a tradeoff between circuit density and manufacturing yield.

Besides the intrinsic defect probability linked to slight imperfections, significant yield decrease can be caused by manufacturing problems (mask defects, under/over etching, etc.). Manufactured circuit nodes can be characterized by their probability of being defective. Referring to FIG. 2, (a) shows a defect probability figure within acceptable bounds that corresponds to a manufacturing line free of errors and well tuned; (b) represents heavy particle contamination represented by high defect probability for most/all nodes; (c) represents a hard mask defect causing a bridge between two adjacent metal lines; (d) corresponds to a more subtle problem where a limited number of nodes have a very high defect probability.

Structural systematic defect manifestation is encountered when a limited number of circuit components have a much higher defect probability than all others, for example, a circuit with a manufacturing defect probability figure similar to the ones shown in FIG. 2(c) or (d). A detailed example is provided by the following analysis:

Consider a circuit $C=R \cup S$ having the following properties:

The probability that a node in R is defective is 0.000001. R contains the nodes not affected by the systematic defect. And contains one million nodes.

The probability that a node in S={x,y,z} is defective is 0.12 (independently from one another). S contains the nodes affected by the systematic defect. We assume that with no systematic defect the probability is the same as in R.

The manufacturing yield is the probability of having a chip with no defect:

Notation: Pr(statement) stands for "Probability that statement is true".

Yield with no systematic defect:

$$Y = Pr(R \text{ with no defect}) \times Pr(S \text{ with no defect})$$
$$= (1 - 0.000001)^{1000000} \times (1 - 0.000001)^3$$
$$= 0.368 \times 0.999997$$
$$= 0.368$$

Yield with systematic defect:

$$Y = Pr(R \text{ with no defect}) \times Pr(S \text{ with no defect})$$
$$= (1 - 0.000001)^{1000000} \times (1 - 0.12)^3$$
$$= 0.368 \times 0.681472$$
$$= 0.25$$

Consequently, the systematic defect causes a yield degradation from 0.368 to 0.25.

$$Pr(\text{only } x \text{ is defective}) = Pr(R \text{ with no defect}) \times Pr(S \backslash x \text{ with no defect}) \times Pr(x \text{ defective})$$
$$= 0.368 \times (1 - 0.12)^2 \times 0.12 = 0.034$$

Pr(only y is defective)=Pr(only z is defective)=0.034
Pr(x and y are defective, not z)=0.12×0.12×(1−0.12)= 0.0126
Pr(x and z are defective, not y)=Pr(y and z are defective, not x)=0.0126
Pr(x, y, and z are defective)=0.12³=0.0017

$$Pr(\text{one or more random defects, no systematic ones}) = (1 - Pr(\text{no random defect})) \times Pr(\text{no systematic defect})$$
$$= (1 - (1 - 0.00001)^{1000000}) \times (1 - 0.12)^3$$
$$= (1 - 0.368) \times 0.68 = 0.43$$

Out of 500 manufactured chips the following is expected:
125 defect free chips
215 chips with pure random defects
Cluster of 60 chips with defective x, classified as:
  17 with defective x only
  6 with defective x, y, and possibly random
  6 with defective x, z, and possibly random
  1 with defective x, y, z, and possibly random
  30 with defective x and random
Cluster of 60 chips with defective y, classified as:
  17 with defective y only
  6 with defective x, y, and possibly random
  6 with defective y, z, and possibly random
  1 with defective x, y, z, and possibly random
  30 with defective y and random
Cluster of 60 chips with defective z, classified as:
  17 with defective z only
  6 with defective x, z, and possibly random
  6 with defective y, z, and possibly random
  1 with defective x, y, z, and possibly random
  30 with defective z and random The union of the three clusters contains 160 chip and they overlap according to Table 1.

TABLE 1

Clusters overlap

|   | x  | y  | z  |
|---|----|----|----|
| x | 60 | 7  | 7  |
| y | 7  | 60 | 7  |
| z | 7  | 7  | 60 |

It is envisioned that LSSD technology, which is well known in the industry, may be used to generate test patterns to determine where defects occur in the logic of the circuits. After failing a pattern, further data collection will determine which latches contain incorrect values. These failing latches and the patterns that made them fail are the starting point of the analysis. As the defect that caused the fail has to have affected the logic that precedes the failing latch, it will be encountered when tracing back from these latches. The traceback may not enable us to recognize directly the defect, but it may give information about its whereabouts.

Tracing back from the failed latches proceeds through combinational logic feeding the failing latches, until controllable latches are encountered. A decision is then made to continue the backtracing or not, depending on whether the latter latches were clocked during the application of one of the failing patterns or not. Each object (net, pin or gate, depending on the particular embodiment) encountered during the backtracing is assigned a weight that may depend on the particular cone that is being traced, the failing latches and the failing patterns. The weights are positive, and are equal to zero when the corresponding object is never encountered during backtracing. This produces a vector of weights for each failing device. The elements of the vector correspond to the objects in the logic description of the design, and many elements will be zero. The vector for a particular failing device is the fail signature for that device.

It would also be possible to assign weights not to objects, but to circuits. In many design styles, logic gates (combinational as well as latches) are chosen from a library of allowed circuits. Each logic gate encountered during tracing is an instance of one such circuit. The result is a vector of weights, each element of which corresponds to a particular circuit in the library. Other variants can easily be considered. For example, the size of the vector can be reduced further by assigning weights not to circuits but to power levels. Logic gates represented in the library typically have multiple implementations with varying power consumption levels. The elements of the vector could be different power consumption levels, independent of the logical function of the circuit.

An alternate way of producing a fail signature, i.e. a vector of weights, is to first perform logic diagnosis using the known failing latches and failing patterns. Logic diagnosis can be done by several industry standard tools, for example TetraMax from the Synopsis company or Test-Bench from IBM. It is a form of backcone tracing, because only the part of the design in the backcones of the failing latches needs to be considered during the diagnostic analysis. The output of the logic diagnosis is a set of objects, like nets or pins, that can be assigned weights, for example related to the quality of the diagnosis. This results in a vector of weights as in the preceding examples, and can be treated similarly.

A fourth way of constructing meaningful fail signatures is by using the function of the failing latches. In some tests, for example those of embedded memories, the latches that can contain failing data are actually related to specific objects, in the present example embedded memories, that can pass or fail the test. In other words, such a latch having an incorrect value indicates that the associated object has failed the test. The object is still in the backcone of the failing latch, but, in this case, typically no backtracing needs to be performed because it is already known to what object the failing latch is related. Again, if the latch fails, a weight can be assigned to the associated failing object, for example one related to the size of the object, and a vector of weights can be constructed.

Finally, a trivial signatures can be constructed by not tracing back at all from the failing latches, but using the failing latches themselves as the signature.

Fail similarity between two failing devices is now determined by comparing the corresponding fail signatures. This produces a matrix of numbers, each number measuring the fail similarity (correlation) between two devices. The correlation numbers, in the present embodiment, are in the range [0, 1]. 1 corresponds to complete equality, 0 to no similarity.

One convenient way to measure similarity is to determine $\cos(\alpha)$, where $\alpha$ is the abstract angle between the two fail signatures. Mathematically, this is (Sum over i of $a(i)*b(i)$)/(norm(a)*norm(b)), Where $a(i)$ and $b(i)$ are the weights of object i in the fail signatures of the two devices. norm(a) is the norm of the fail signature a, and is defined as SQRT (Sum over i of $a(i)*a(i)$).

$\cos(\alpha)$ is between 0 and 1, and has the desired property that it equals 1 when $a(i)$ and $b(i)$ are the same for all i, and equals 0 when $a(i)$ and $b_i$ are never simultaneously non-zero for any i.

Finally, clusters of devices that fail in a similar manner can be found by using any of a large number of standard clustering techniques. The input to such clustering techniques is the correlation matrix between the fail signature of the failing devices. Various clustering techniques can be found in the literature, for example see William R Dillon and Matthew Goldstein, "Multivariate Analysis Methods and Applications," John Wiley and Sons, 1984.

The clustering technique used in this embodiment is an agglomerative one, based on the nearest neighbor method. The clustering starts out with each device being put in a separate cluster, and then proceeds by successively merging clusters that have, at that point in the process, the largest commonality. The commonality between clusters is defined as the smallest commonality between any two devices, one in each cluster. The process stops if there are no two clusters with a commonality larger than a specified threshold.

The result is a set of clusters, such that the devices in each cluster are similar to the devices in the same cluster in the sense that the commonality between any two devices in the same cluster exceeds the specified threshold. Systematic defects, whether caused by process problems or by design problems, show up as large clusters. Badly designed cells in the design library, for example, may cause large clusters to appear when the fail signatures are based on the cells found during the backtracing, while a severe layout problem may show up in the signatures based on the nets found during the backtracing.

Accordingly, it is an object of the present invention to use failing latches and backcones of those latches of the failing device to construct meaningful fail signatures and to determine fail similarity.

Another object of the invention is to group a set of failing chips by a common systematic defect. Another object is to find systematic effects among failing devices. Another object is to determine non-trivial correlation among failing devices to determine a systematic cause.

DETAILED DESCRIPTION OF PREFERRED EMBODIMENT

Figure 1:
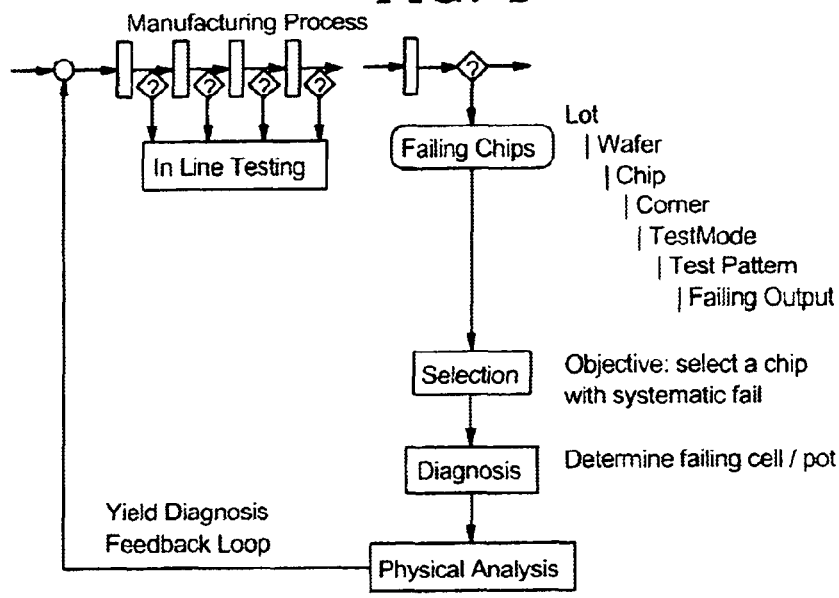
FIG. 1 is a diagram illustrating a simplified manufacturing feed back loop.
Figure 2:
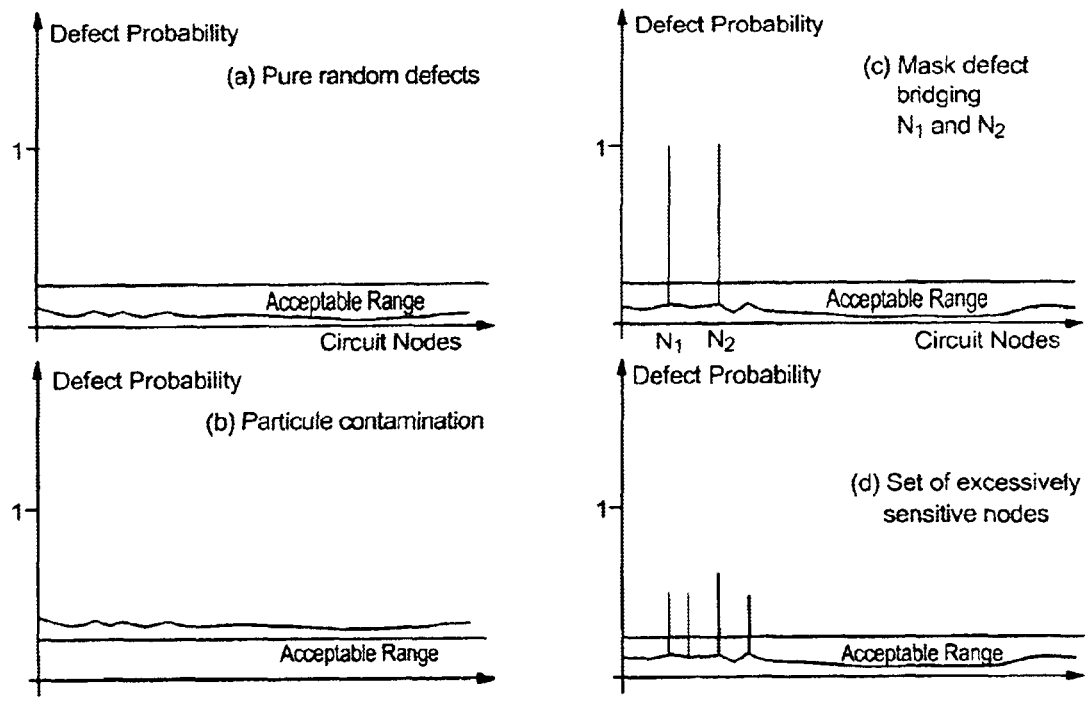
FIGS. 2a, 2b, 2c and 2d are graphs of defect probability versus circuit nodes for various defects which are: (a) pure random, (b) particle contamination, (c) mask defect bridging and (d) a set of excessively sensitive nodes.
Figure 3:
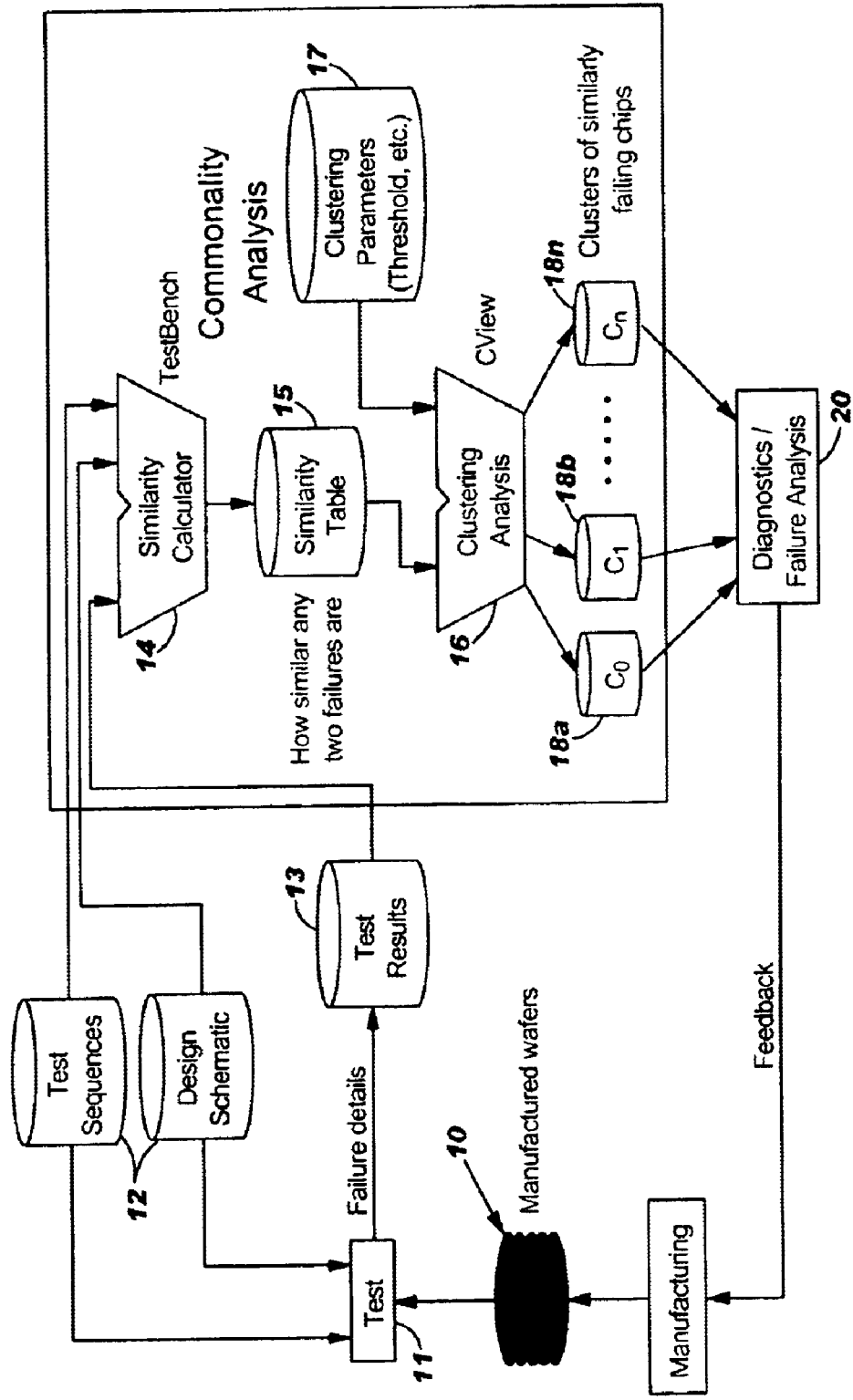
FIG. 3 is a flow chart illustrating the commonality analysis in accordance with the present invention.

Attention is now directed to FIG. 3, which illustrates the data flow and how the commonality analysis is performed in accordance with the present invention. After the wafers 10 are manufactured, various tests 11 are performed using LSSD, scan chains using applicable test sequences 12, and the logic design description. The test result 13 are collected and transmitted to the similarity calculator 14, along with the applicable test sequences 12 and the logic design description. The results of the similarity calculator are transmitted to similarity table 15. Table 15 is fed into the clustering analysis 16, along with certain clustering parameters 17. The results of the clustering analysis determines the clusters of similarly failing chips 18a...18n. These results may be used in diagnostics and failure analysis 20, and be fed back to improve manufacturing of the wafers.

We will now focus on the simularity calculator 14. During testing it is necessary to track the latches that contain incorrect values at the completion of a test pattern. The defect that caused the fail is likely to be close to such latches, because fault effects caused by the defect flow along signal wires that do not commonly cross large distances over the chip. Consequently, when fault effects propagate away from the location of the defect, they will usually not travel far before they are stored into latches. If a fault effect is stored in a latch, this latch will, upon inspection at the end of the test pattern, contain an incorrect value. Such a latch is commonly called a failing latch, although, usually, the latch as a logic circuit is defect free.

It makes sense then to follow the fault effects in the opposite direction: start from the failing latches and trace through the logic backwards until primary inputs, embedded memories, or other latches are encountered, and store all the objects that were encountered during the tracing in a list. The objects can be nets, pins, logic gates, logic macros like memories, etc.

Backtracing through combinational logic is straightforward, because all the logic elements are unidirectional, and the backtrace always arrives at the output of a logic gate, and needs to continue backwards from the inputs. It stops at primary inputs. Most test patterns are such that embedded memories provide a constant set of logic values on their outputs, and no further tracing needs to be performed through them when they are encountered during the backtrace. Latches, when encountered however, require more consideration.

Figure 4:
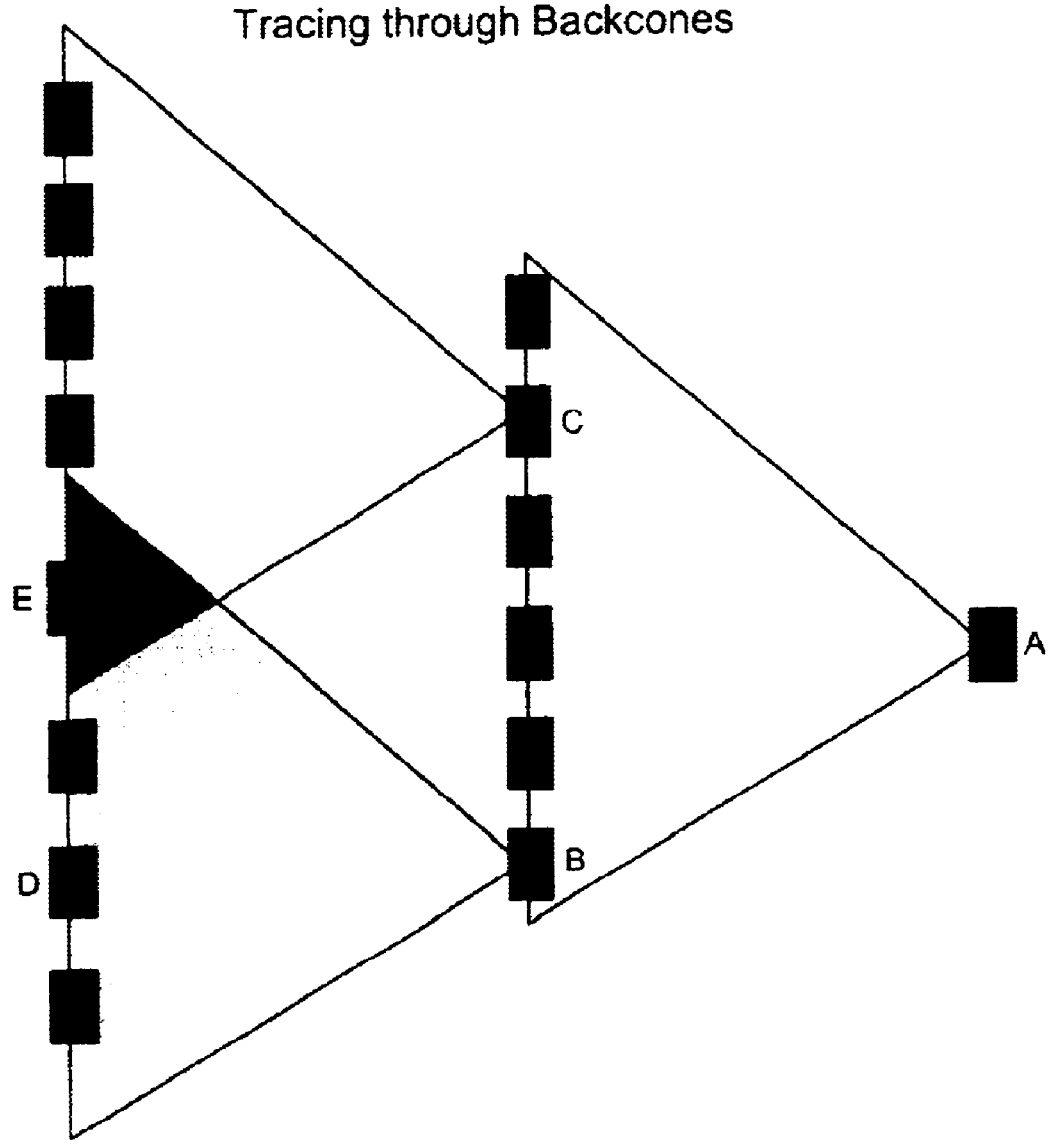
FIG. 4 shows schematic backcones.

For example, in FIG. 4, the tracing of a cone starts at failing latch A. The cone rooted at A contains combinational logic, and is bordered by several latches. The tracing of the cone may have to be continued through these latches if they are clocked with a clock pulse that precedes the one that clocks latch A. The figure shows the case that latches B and C are clocked during the application of the test pattern before A is clocked. Consequently, tracing continues through these latches and through more combinational logic, as shown by the additional two combinational cones. When latches D or E are reached, a decision has to be made whether or not to continue the tracing. At D this decision depends on whether its clock pulse, if any, occurs before the one at B. At E, the choice is more complicated, and the clock pulses at E, B and C all have to be taken into account. Tracing continues at E if its clock pulse precedes either the one at B or the one at C, because fault effects through E could continue through B or through C.

If a latch has multiple ports, as many do, then the tracing should continue only from the port that was clocked. Furthermore, there is a choice between tracing through the data input or through the clock input of a clocked port. Tracing needs to follow only clock inputs when it is clear that the defect does affect the clock lines. If only a single defect is assumed to be present, the data lines need not be traced in that case. Usually, however, it is not clear whether the defect affects clock lines or not, and tracing has to continue from both clock inputs and data inputs.

Each trace starts from a failing latch and defines a backcone to that latch. This backcone is the sum of the combinational cones and latches encountered during the tracing. FIG. 4 shows a complex backcone consisting of three distinct combinational logic cones. Note that backcones from the same latch may be different for different patterns, because the sequences of clock pulses in the patterns may differ. During the backtrace, all the encountered objects are stored in a list.

All objects (nets, pins, gates, . . . depending on the particular embodiment) encountered during the backtracing are assigned a weight that may depend on the particular cone that is being traced, the failing latch from which the trace started, and the failing pattern. The weights are positive, and are equal to zero when the corresponding object is never encountered during backtracing. This produces a vector of weights for each failing device. The elements of the vector correspond to the objects in the logic description of the design, and many elements will be zero. The vector for a particular failing device is the fail signature for that device.

One possible weight would be the number of times the object is encountered during the backtraces from the failing latches. The resulting signature is a list of (object, v) pairs, in which v is the number of times this object was encountered during the backtraces. A high v value shows that the corresponding object is in the backcones of many failing latches. The v values, therefore, form a rough estimation of the likelihood that the defect is located on or near any of the objects in any of the backcones.

It is useful to compare this signature with the result of a crude form of diagnosis that is sometimes employed, called intersection. In intersection, the objects are nets or pins and backcones are obtained as above, but instead of incrementing counters, the backcones are kept as sets and the intersection is taken of all these sets. The result is a set of objects that are in all the backcones. The theory behind this form of diagnosis is that only objects in the intersection can be the location of the defect, because otherwise fault effects from the defect could not have propagated to all the failing latches. Unfortunately, not all defects affect single objects. Bridges, for example, affect at least two, and the latches downstream from one leg of the bridge may not be the same as the ones downstream from the other leg. Consequently, intersecting backcones from the failing latches may result in an empty set. Using the backcones based signature, however, circumvents this problem. It lists all the objects ever encountered in any of the backtraces, but it ranks them according to how often they were encountered. The group of objects most often encountered form then a generalization of the intersection, one that does not suffer from the problem of potentially being empty.

Another possible weight would be obtained by adding each time the object is encountered during a backtrace a certain amount that depends on the cone being traced at the time. For example, this amount could be $1/|C|$, where $|C|$ is a size indicator of the cone, like the number of objects in the cone. Large cones will be de-emphasized, and objects that occur only in very large cones will have small weights. A object that occurs in a small cone however, is considered more meaningful, and will have a proportionally larger weight.

Instead of keeping track of which objects are encountered during backtracing, one can also notice their functional properties. These can include the logic function, drive strength, power level, delay times, etc. All these details are encoded in the cell name of the block, if the object is a block, which is a reference to a specific circuit in the design library of which this block is an instance. All the physical and layout details of the block can be found in the description of the library circuit.

Monitoring cells rather than nodes during backtracing is sometimes useful when the defect is not one that impacts a specific instance of a library circuit, but, instead, one that impacts the library circuit itself; perhaps a defect prone layout style, an underpowered driver, or any other design flaw that will affect all instances of that circuit. The resulting signature is very similar to the one discussed in the previous paragraph, except that now the n component of the (n, v) pairs is not the name of a node or a circuit instance, but the name of the circuit itself Signatures that have high counts of certain circuits hint at problems with that circuit, rather than at some point defect somewhere on the device.

The list of possible n values can be reduced further by using only specific features of the cells, like their power levels, number of transistors, etc. Logic gates represented in the library typically have multiple implementations with varying power consumption levels. The elements of the vector could be different power consumption levels, independent of the logical function of the circuit.

Fail similarity between two failing devices is now determined by comparing the corresponding fail signatures. This produces a correlation matrix of numbers, each number measuring the fail similarity (correlation) between two devices. The correlation numbers, in this embodiment, are in the range [0, 1]. 1 corresponds to complete equality, 0 to zero similarity. One convenient way to measure similarity is to determine $\cos(\alpha)$, where $\alpha$ is the abstract angle between the two fail signatures. Mathematically, this is (Sum over i of $a(i)*b(i)$)/(norm($a$)*norm($b$)), Where $a(i)$ and $b(i)$ are the weights of node i in the fail signatures of the two devices. norm($a$) is norm of the fail signature $a$, and is defined as SQRT(Sum over i of $a(i)*a(i)$).

This number is between 0 and 1, and has the desired property that it equals 1 when a(i) and b(i) are the same for all i, and equals 0 when a(i) and bi) are never simultaneously non-zero for any i.

This invention is not restricted to this particular similarity measure. For example, one possible weight would be 1 or 0, depending on whether or not the object was ever encountered during any of the backtraces. With such a weight, an alternate similarity measure might be (Sum over i of a(i)*b(i))/(Sum over i of a(i)+b(i)−a(i)*b(i)).

Finally, clusters of devices that fail in a similar manner can be found by using any of a large number of standard clustering techniques. The input to such clustering techniques is the correlation matrix between the fail signature of the failing devices. Various clustering techniques can be found in the literature, for example see William R Dillon and Matthew Goldstein, "Multivariate Analysis Methods and Applications," John Wiley and Sons, 1984.

The clustering technique used in this embodiment is an agglomerative one, based on the nearest neighbor method. The clustering starts out with each device being put in a separate cluster, and then proceeds by successively merging clusters that have, at that point in the process, the largest commonality. The commonality between clusters is defined as the smallest commonality between any two devices, one in each cluster. The process stops if there are no two clusters with a commonality larger than a specified threshold.

The result is a set of clusters, such that the devices in each cluster are similar to the devices in the same cluster in the sense that the commonality between any two devices in the same cluster exceeds the specified threshold. Systematic defects, whether caused by process problems or by design problems, show up as large clusters. Badly designed cells in the design library, for example, may cause large clusters to appear when the fail signatures are based on the cells found during the backtracing, while a severe layout problem may show up in the signatures based on the nets found during the backtracing.

While the invention has been shown and described with respect to particular embodiments thereof, it will be understood by those skilled in the art that changes in form and detail may be made without departing from the spirit and scope of the invention.

What is claimed:

1. A method for detecting systematic defects occurring on wafers having several chips which have a plurality of devices with scannable latches for logic testing comprising:

testing the logic for each device, and storing the latches that contained an incorrect logic value after completion of any test, as well as the identification of the associated failing tests;

backtracing through a cone of logic from the latches having incorrect values;

assigning a weighting value for objects encountered during backtracing to produce a vector of weights for each failing device;

determining a fail signature based on the vector; and comparing fail signatures of any two failing devices to determine similarity of the failure.

2. The method of claim 1 wherein the objects are logic gates.

3. The method of claim 1 wherein the objects are nets between logic gates.

4. The method of claim 1 wherein the objects are logic functions of the logic gates.

5. The method of claim 1 wherein the objects are library circuits used to implement the logic gates.

6. The method of claim 1 wherein the objects are design features of the library circuits used to implement the logic gates.

7. The method of claim 1 wherein the weights are the number of times each object is encountered during backtracing.

8. The method of claim 7 wherein the objects are logic gates.

9. The method of claim 7 wherein the objects are nets between logic gates.

10. The method of claim 7 wherein the objects are logic functions of logic gates.

11. The method of claim 7 wherein the objects are library circuits used to implement logic gates.

12. The method of claim 7 wherein the objects are design features of library circuits used to implement logic gates.

13. The method of claim 1 wherein the weights are determined by adding each time the objects are encountered during backtracing an amount that depends on the size of the cone.

14. The method of claim 13 wherein the objects are logic gates.

15. The method of claim 13 wherein the objects are nets between logic gates.

16. The method of claim 13 wherein the objects are logic functions of the logic gates.

17. The method of claim 13 wherein the objects are library circuits used to implement logic gates.

18. The method of claim 13 wherein the objects are design features of library circuits used to implement the gates.

19. The method of claim 1 in which the objects encountered during the backtrace are the failing latches from which the backtrace begins.

20. The method of claim 1 in which backtracing is done only for failing latches that indicate whether an object in the design passed or failed the test, and in which the objects encountered during the backtrace are the objects whose pass/fail status are indicated by the failing latches.

21. The method of claim 1 in which the backtrace includes a logic diagnosis of the failing information collected in the failing latches, using that portion of the design encountered during the backtrace;

the objects encountered during the backtrace are logic design entities implicated by the logic diagnosis as the most likely entities to be affected by the defect.

22. The method of claim 1 by adding the step of clustering the fail signatures to determine systematic defects.

* * * * *